(12) United States Patent
Park et al.

(10) Patent No.: US 7,834,397 B2
(45) Date of Patent: Nov. 16, 2010

(54) THIN FILM TRANSISTOR, METHOD OF FABRICATING THE SAME, AND A DISPLAY DEVICE INCLUDING THE THIN FILM TRANSISTOR

(75) Inventors: Byoung-Keon Park, Suwon-si (KR);
Byoung-Deog Choi, Suwon-si (KR);
Myeong-Seob So, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 289 days.

(21) Appl. No.: 11/509,853

(22) Filed: Aug. 25, 2006

(65) Prior Publication Data
US 2007/0052022 A1    Mar. 8, 2007

(30) Foreign Application Priority Data
Aug. 26, 2005   (KR)   ............... 10-2005-0078757

(51) Int. Cl.
*H01L 27/12*   (2006.01)
(52) U.S. Cl. .............. 257/347; 257/E21.413; 349/42; 349/43
(58) Field of Classification Search ......... 257/288, 257/59, 72, 347, E51.006, E29.117, E29.273; 349/42, 43
See application file for complete search history.

(56) References Cited

U.S. PATENT DOCUMENTS

| | | | |
|---|---|---|---|
| 6,028,580 A * | 2/2000 | Kosegawa et al. ............ 345/98 |
| 6,252,247 B1 * | 6/2001 | Sakata et al. ................. 257/57 |
| 6,828,584 B2 * | 12/2004 | Arao et al. ..................... 257/57 |
| 7,064,388 B2 * | 6/2006 | Hayakawa et al. .......... 257/347 |
| 7,189,997 B2 * | 3/2007 | Tsunoda et al. ............... 257/72 |
| 7,271,870 B2 * | 9/2007 | Ono et al. ..................... 349/149 |
| 7,279,714 B2 * | 10/2007 | Koo et al. ..................... 257/72 |
| 7,368,724 B2 * | 5/2008 | Morii et al. ............ 250/370.01 |
| 7,411,298 B2 * | 8/2008 | Kawakami et al. .......... 257/741 |
| 7,430,024 B2 * | 9/2008 | Yagi et al. ..................... 349/54 |
| 7,450,192 B2 * | 11/2008 | Ono et al. ..................... 349/43 |
| 2004/0222429 A1 * | 11/2004 | Yamazaki et al. ............. 257/79 |

(Continued)

FOREIGN PATENT DOCUMENTS

JP    10-229199    8/1998

(Continued)

OTHER PUBLICATIONS

Patent Abstracts of Japan, Publication No. 10-229199, dated Aug. 25, 1998, in the name of Tatsuya Okubo et al.

(Continued)

*Primary Examiner*—Leonardo Andújar
*Assistant Examiner*—William Harriston
(74) *Attorney, Agent, or Firm*—Christie, Parker & Hale, LLP

(57) ABSTRACT

A thin film transistor (TFT), a method of fabricating the same, and a display device including the TFT, are provided. In the TFT, a channel region is connected to a gate electrode so that the influence of a substrate bias is reduced or eliminated. Thus, the threshold voltage of the TFT is reduced, a sub-threshold slope can be improved, and a large drain current can be obtained at a low gate voltage.

18 Claims, 14 Drawing Sheets

U.S. PATENT DOCUMENTS

| | | | |
|---|---|---|---|
| 2005/0082530 A1* | 4/2005 | Koo et al. | 257/66 |
| 2005/0088582 A1* | 4/2005 | Park et al. | 349/43 |
| 2005/0205866 A1* | 9/2005 | Kim et al. | 257/59 |
| 2005/0218405 A1* | 10/2005 | Yamazaki et al. | 257/66 |
| 2006/0181198 A1* | 8/2006 | Gotoh et al. | 313/503 |
| 2008/0006826 A1* | 1/2008 | Kawachi | 257/70 |
| 2008/0156368 A1* | 7/2008 | Hirose et al. | 136/256 |

FOREIGN PATENT DOCUMENTS

| | | |
|---|---|---|
| JP | 2001-44441 | 2/2001 |
| KR | 10-2005-0036625 | 4/2005 |

OTHER PUBLICATIONS

Patent Abstracts of Japan, Publication No. 2001-044441, dated Feb. 16, 2001, in the name of So Nakayama.

Korean Patent Abstracts, Publication No. 1020050036625 A, dated Apr. 20, 2005, in the name of Byoung Deog Choi et al.

* cited by examiner

THIN FILM TRANSISTOR, METHOD OF FABRICATING THE SAME, AND A DISPLAY DEVICE INCLUDING THE THIN FILM TRANSISTOR

CROSS-REFERENCE TO RELATED APPLICATION

This application claims priority to and the benefit of Korean Patent Application No. 10-2005-0078757, filed Aug. 26, 2005, the entire content of which is incorporated herein by reference.

BACKGROUND OF THE INVENTION

1. Field of the Invention

The present invention relates to a thin film transistor (TFT), a method of fabricating the same, and a display device including the TFT, and more particularly, to a TFT in which a channel region is connected to a gate electrode, and a method of fabricating the same.

2. Description of Related Art

An organic light emitting diode (OLED) display device is an emissive device with excellent viewing angle and contrast. Since a separate light source such as a backlight is not required, unlike liquid crystal display devices (LCDs), the OLED display device may be made lightweight and thin, and consumes less power than conventional cathode ray tube (CRT) display devices.

Furthermore, the OLED display device can be driven with direct current at a low voltage and has a fast response speed. Also, since the OLED display device is fabricated using only solid materials, it is highly resistant to external shock, can be used in an environment having a wide range of temperatures, and is simple and inexpensive to manufacture.

Some flat panel displays (FPDs), such as an OLED display device or an LCD, employ thin film transistors (TFTs) as switching devices and/or driving devices.

The TFTs used in these FPDs, may be bottom-gate TFTs.

FIG. 1 is a cross-sectional view of a conventional bottom-gate TFT.

Referring to FIG. 1, a buffer layer 101 is disposed on a substrate 100, such as a glass substrate or a plastic substrate, a gate electrode 102 is disposed on the buffer layer 101, a gate insulating layer 103 is disposed on the entire surface of the substrate 100 on which the gate electrode 102 is disposed, and a semiconductor layer 104 is disposed on the gate insulating layer 103 at a position corresponding to the gate electrode 102.

The semiconductor layer 104 includes at least a channel region 104a and source and drain regions 104b. Also, source and drain electrodes 105 are respectively disposed on the source and drain regions 104b of the semiconductor layer 104, and electrically connected to the source and drain regions 104b, respectively. In this case, a heavily doped silicon layer, i.e., an n+ silicon layer 106 is disposed on the source and drain regions 104b in order to lower contact resistance between the source and drain regions 104b and the source and drain electrodes 105, respectively.

However, when the bottom-gate TFT is used in an FPD such as an OLED display device, a substrate bias leads to an increase in a threshold voltage, and a subthreshold slope deteriorates.

SUMMARY OF THE INVENTION

An exemplary embodiment according to the present invention provides a thin film transistor (TFT), a method of fabricating the same, and a display device including the TFT. With the TFT of the exemplary embodiment: the influence of a substrate bias is reduced or eliminated, such that a threshold voltage is reduced; a subthreshold slope is improved; and a channel region and a gate electrode are electrically connected, such that a large drain current is obtained at a low gate voltage.

In an exemplary embodiment according to the present invention, a TFT includes: a substrate; a gate electrode disposed on the substrate; a gate insulating layer disposed on the gate electrode; a semiconductor layer disposed on the gate insulating layer and including a channel region and source and drain regions; an interconnection portion contacting the channel region of the semiconductor layer; and a gate-body contact portion electrically connecting the interconnection portion and the gate electrode.

In another exemplary embodiment according to the present invention, a TFT includes: a substrate; a gate electrode and a semiconductor layer disposed on the substrate, the semiconductor layer having a region overlapping the gate electrode; an interconnection portion electrically contacting the overlapped region of the semiconductor layer, a contact region between the interconnection portion and the overlapped region of the semiconductor layer being smaller than the overlapped region of the semiconductor layer; and a gate-body contact portion electrically connecting the interconnection portion and the gate electrode.

In still another exemplary embodiment according to the present invention, a method of fabricating a TFT includes: positioning a gate electrode on the substrate; positioning a gate insulating layer on the gate electrode; positioning a first silicon layer and a second silicon layer on the gate insulating layer; positioning a conductive layer on the substrate having the second silicon layer; etching the conductive layer to form source and drain electrodes at positions corresponding to source and drain regions of the first silicon layer and to form an interconnection portion at a position corresponding to a region of a channel region of the first silicon layer; etching a region of the second silicon layer that is exposed by etching the conductive layer; and positioning a gate-body contact portion to connect the interconnection portion and the gate electrode.

In yet another exemplary embodiment according to the present invention, a method of fabricating a TFT includes: positioning a gate electrode on the substrate; positioning a gate insulating layer on the gate electrode; positioning a first silicon layer on the gate insulating layer; positioning an interconnection portion on the substrate having the first silicon layer; positioning a conductive layer on the substrate having the interconnection portion and etching the conductive layer to form source and drain electrodes; and positioning a gate-body contact portion to electrically connect the interconnection portion and the gate electrode.

In yet another exemplary embodiment according to the present invention, a display device is provided. The display device includes: a substrate; and a plurality of pixels disposed on the substrate. At least one of the pixels includes a thin film transistor (TFT) including: a gate electrode disposed on the substrate; a gate insulating layer disposed on the gate electrode; a semiconductor layer disposed on the gate insulating layer and including a channel region, a source region and a drain region; an interconnection portion contacting the channel region of the semiconductor layer; and a gate-body contact portion electrically connecting the interconnection portion and the gate electrode.

BRIEF DESCRIPTION OF THE DRAWINGS

The above and other features of the present invention will be described in reference to certain exemplary embodiments thereof with reference to the attached drawings in which.

DETAILED DESCRIPTION

Figure 1:
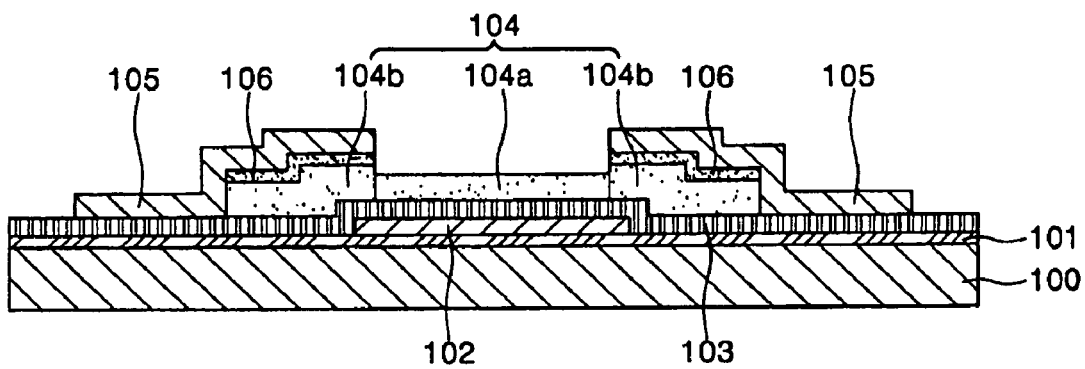
FIG. 1 is a cross-sectional view of a conventional bottom-gate thin film transistor (TFT)

The present invention will now be described more fully hereinafter with reference to the accompanying drawings, in which exemplary embodiments of the invention are shown. In the drawings, the thicknesses of layers and regions are exaggerated for clarity. The same reference numerals are used to denote the same elements.

Exemplary Embodiment 1

Figure 2A:
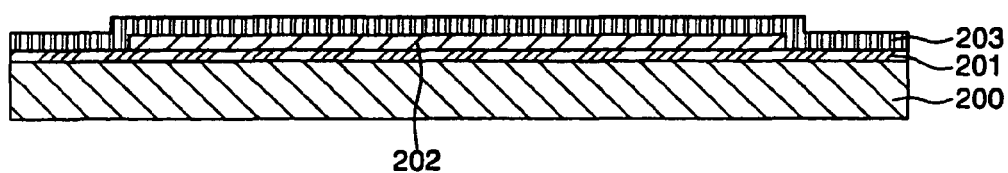
FIGS. 2A, 3A, 4A, 5A, and 6A are cross-sectional views illustrating a method of fabricating a TFT according to an exemplary embodiment of the present invention.
Figure 2B:
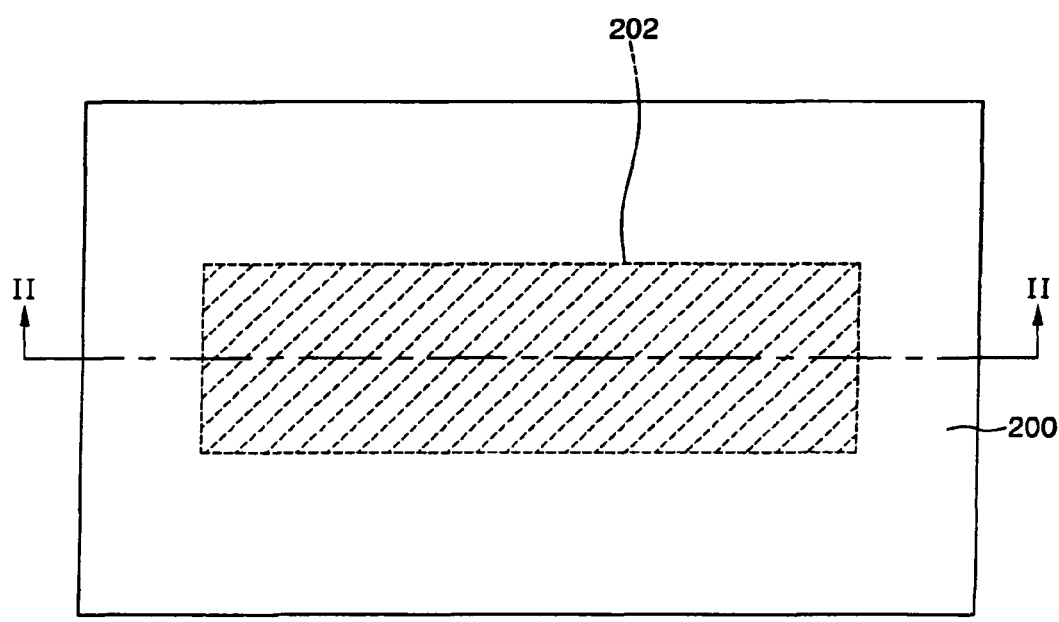
FIGS. 2B, 3B, 4B, 5B, and 6B are plan views of the TFT fabricating stages depicted in FIGS. 2A, 3A, 4A, 5A, and 6A, respectively.

FIG. 2A is a cross-sectional view illustrating a method of fabricating a TFT according to an exemplary embodiment of the present invention, and FIG. 2B is a plan view of the partially fabricated TFT depicted in FIG. 2A. The cross-section of FIG. 2A is taken along the line II-II of FIG. 2B.

Referring to FIGS. 2A and 2B, a buffer layer 201 is formed on a substrate 200, which is a glass substrate or a plastic substrate. The buffer layer 201 prevents moisture or impurities generated on the substrate from diffusing into an element to be formed later and to regulate a heat transmission rate during crystallization, thereby enabling a semiconductor layer to be smoothly crystallized.

Thereafter, a material for a gate electrode is formed on the buffer layer 201 and then patterned, thereby forming a gate electrode 202.

Thereafter, a gate insulating layer 203 is formed on the substrate 200 having the gate electrode 202. In this case, the gate insulating layer 203 may be a silicon oxide layer, a silicon nitride layer, or a composite layer of the silicon oxide and silicon nitride layers.

Figure 3A:
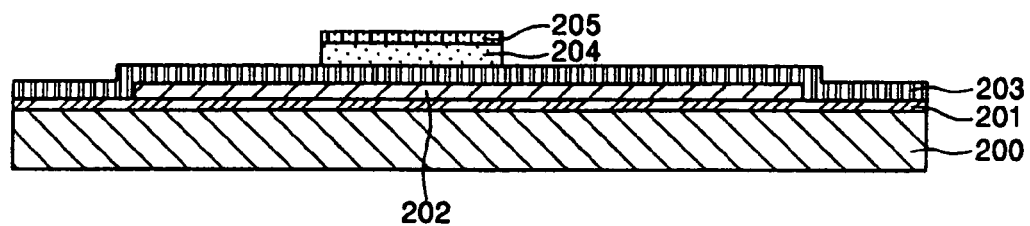
Figure 3B:
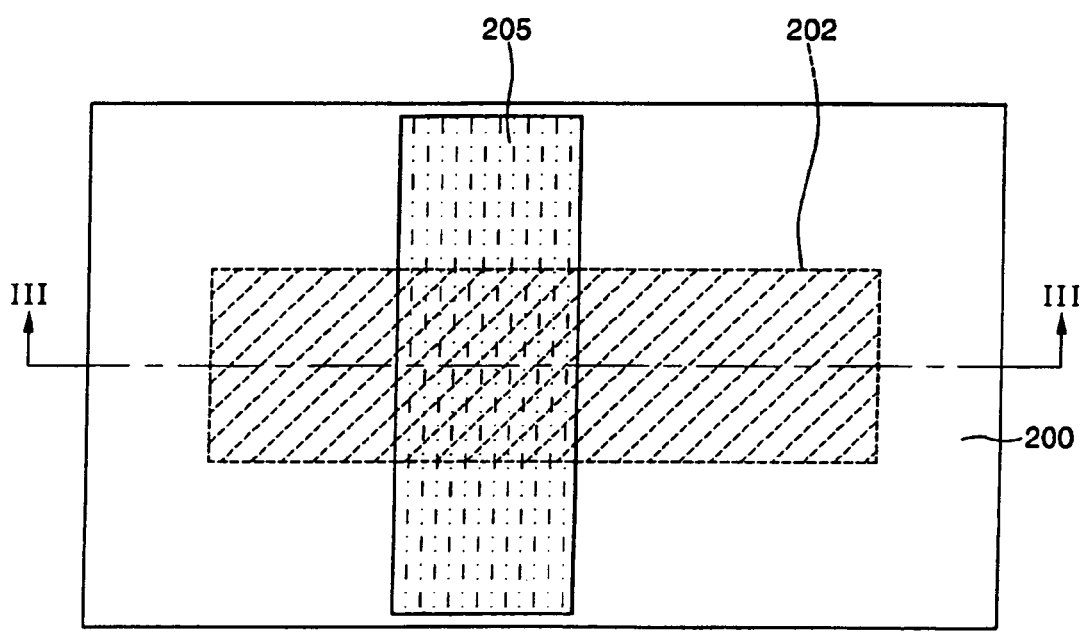

FIG. 3A is a cross-sectional view illustrating a method of fabricating a TFT according to an exemplary embodiment of the present invention, and FIG. 3B is a plan view of the partially fabricated TFT depicted in FIG. 3A. The cross-section of FIG. 3A is taken along the line III-III of FIG. 3B.

Referring to FIGS. 3A and 3B, a first silicon material is deposited on the substrate 200 having the gate insulating layer 203. A second silicon material is deposited on the first silicon material. After that, the first silicon material and the second silicon material are patterned, thereby forming a first silicon layer 204 and a second silicon layer 205.

In this case, an a-Si:H layer may be deposited as the first silicon material on the gate insulating layer 203 using a physical vapor deposition (PVD) process, a chemical vapor deposition (CVD) process, or any other suitable process known to those skilled in the art. Also, the a-Si:H layer may be crystallized into a polycrystalline silicon (poly-Si) layer and then patterned to form the first silicon layer 204. Here, the crystallization of the a-Si:H layer may be performed by a rapid thermal annealing (RTA) process, a solid phase crystallization (SPC) process, an excimer laser crystallization (ELA) process, a metal induced crystallization (MIC) process, a metal induced lateral crystallization (MILC) process, a sequential lateral solidification (SLS) process, or any other suitable process known to those skilled in the art.

The second silicon layer 205 is a heavily doped silicon layer, which electrically connects the first silicon layer 204 and a layer formed on the second silicon layer 205. In particular, the second silicon layer 205 may be formed of an $n^+$-Si layer to lower contact resistance.

In the above-described method, the first silicon layer 204 and the second silicon layer 205 are separately deposited and then patterned. However, the first silicon layer 204 and the second silicon layer 205 may be formed by another method in other embodiments. By way of example, in one embodiment, a first silicon material is deposited on the gate insulating layer 203. Thereafter, impurities are heavily doped into the first silicon material so that the first silicon material is changed into a second silicon material to a predetermined depth. Then, the first silicon material and the second silicon material are patterned, thereby forming the first silicon layer 204 and the second silicon layer 205.

The first silicon layer 204 and the second silicon layer 205 may overlap the gate electrode 202 at a predetermined region. In this case, the predetermined region may be defined as a channel region.

Figure 4A:
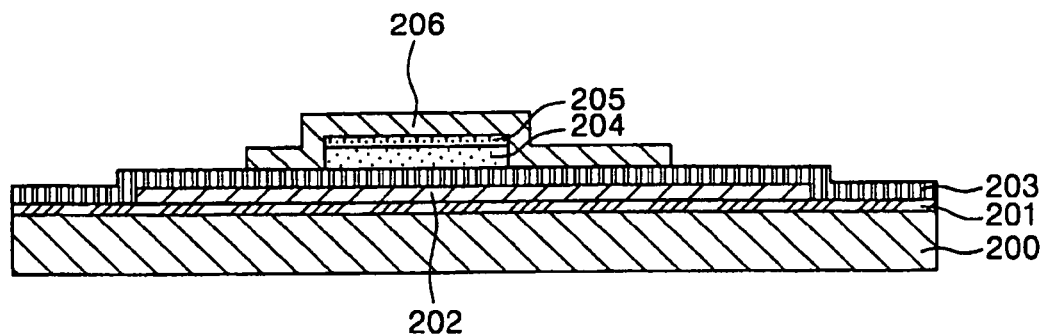
Figure 4B:
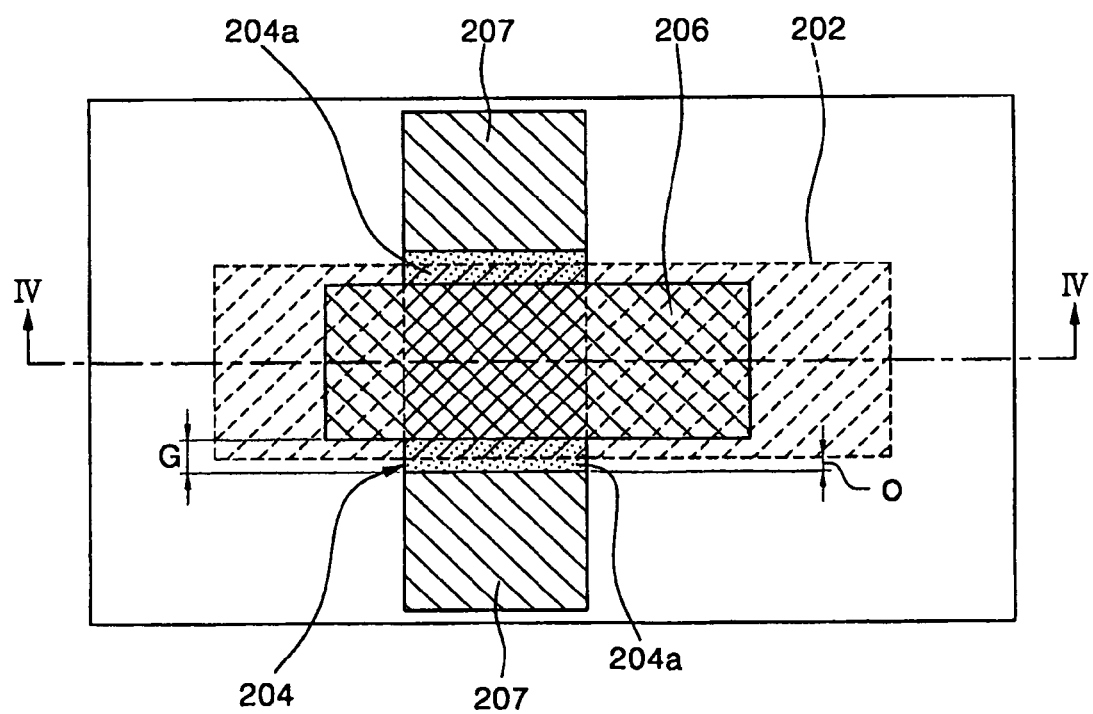

FIG. 4A is a cross-sectional view illustrating a method of fabricating a TFT according to an exemplary embodiment of the present invention, and FIG. 4B is a plan view of the partially fabricated TFT depicted in FIG. 4A. The cross-section of FIG. 4A is taken along the line IV-IV of FIG. 4B.

Referring to FIGS. 4A and 4B, a conductive layer is formed on the substrate 200 having the first silicon layer 204 and the second silicon layer 205 and then patterned, thereby forming an interconnection portion 206 and source and drain electrodes 207.

Referring to FIG. 4B, a portion of the second silicon layer 205 is exposed and etched by etching the conductive layer, so that the underlying first silicon layer 204 is exposed. In this case, the process of etching the conductive layer and the process of etching the second silicon layer 205 are sequentially performed. First, the conductive layer is formed on the entire surface of the substrate 200, and a pattern for forming the interconnection portion 206 and the source and drain electrodes 207 is formed. Then, the conductive layer is etched to form the interconnection portion 206 and the source and drain electrodes 207. Further, the exposed portion of the second silicon layer 205 between the interconnection portion 206 and the source and drain electrodes 207 is etched and completely removed, and the first silicon layer 204 is exposed.

Here, the exposed portion of the second silicon layer 205 should be completely removed in order to prevent the second silicon layer 205, which is a heavily doped silicon layer, from functioning as a conductive material that electrically connects the interconnection portion 206 and the source and drain electrodes 207. Accordingly, intervals "G" between the interconnection portion 206 and the source and drain electrodes 207 may be wide enough to prevent short-circuiting between the interconnection portion 206 and the source and drain electrodes 207.

The interconnection portion 206 may have a width equal to or slightly less than the width of a region where the first silicon layer 204 overlaps the gate electrode 202 (i.e., the channel region). Here, regions of the first silicon layer 204, which do not overlap the gate electrode 202, may be defined as source and drain regions. In this case, the interconnection portion 206 can effectively remove hole-electron pairs generated by the channel region.

In this case, impurities may be lightly doped into the exposed region of the first silicon layer 204 using the interconnection portion 206 and the source and drain electrodes 207 as masks, thereby forming lightly doped drain (LDD) regions 204a. That is, a region of the first silicon layer 204 under the interconnection portion 206 may be defined as a channel region, regions of the first silicon layer 204 under the source and drain electrodes 207 may be defined as source and drain regions, and regions of the first silicon layer 204 between the interconnection portion 206 and the source and drain electrodes 207 may be defined as LDD regions 204a.

Alternatively, the process of lightly doping the impurities may not be performed. In this case, since there are intervals "O" between the gate electrode 202 and the source and drain electrodes 207, the exposed regions of the first silicon layer 204 may be defined as offset regions.

Accordingly, the first silicon layer 204 may be a semiconductor layer that includes at least the channel region and the source and drain regions and further includes the LDD regions 204a or the offset regions.

Figure 5A:
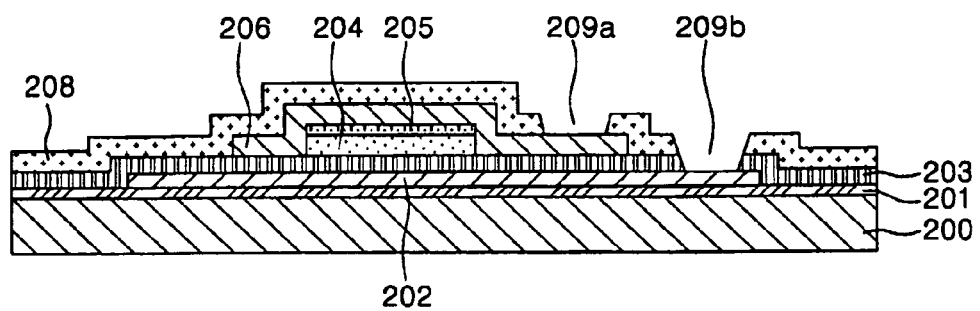
Figure 5B:
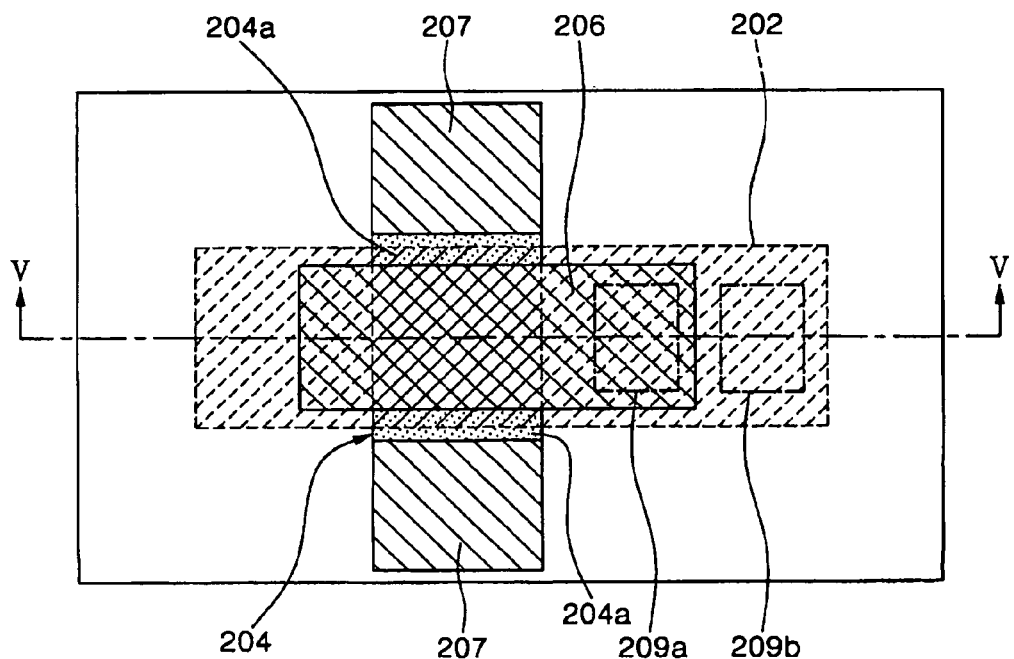

FIG. 5A is a cross-sectional view illustrating a method of fabricating a TFT according to an exemplary embodiment of the present invention, and FIG. 5B is a plan view of the partially fabricated TFT depicted in FIG. 5A. The cross-section of FIG. 5A is taken along the line V-V of FIG. 5B.

Referring to FIGS. 5A and 5B, an interlayer insulating layer 208 is formed on the substrate 200 having the interconnection portion 206.

Thereafter, a predetermined region of the interlayer insulating layer 208 is etched, thereby forming a first contact hole 209a to expose a predetermined region of the interconnection portion 206. Also, predetermined regions of the interlayer insulating layer 208 and the gate insulating layer 203 are etched, thereby forming a second contact hole 209b to expose a predetermined region of the gate electrode 202.

Figure 6A:
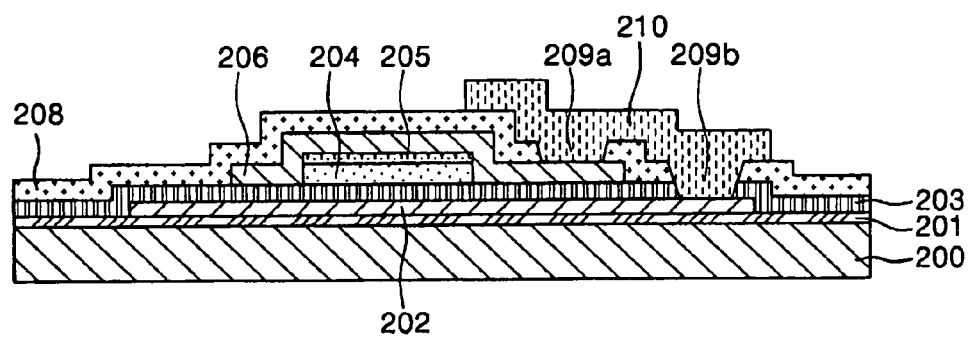
Figure 6B:
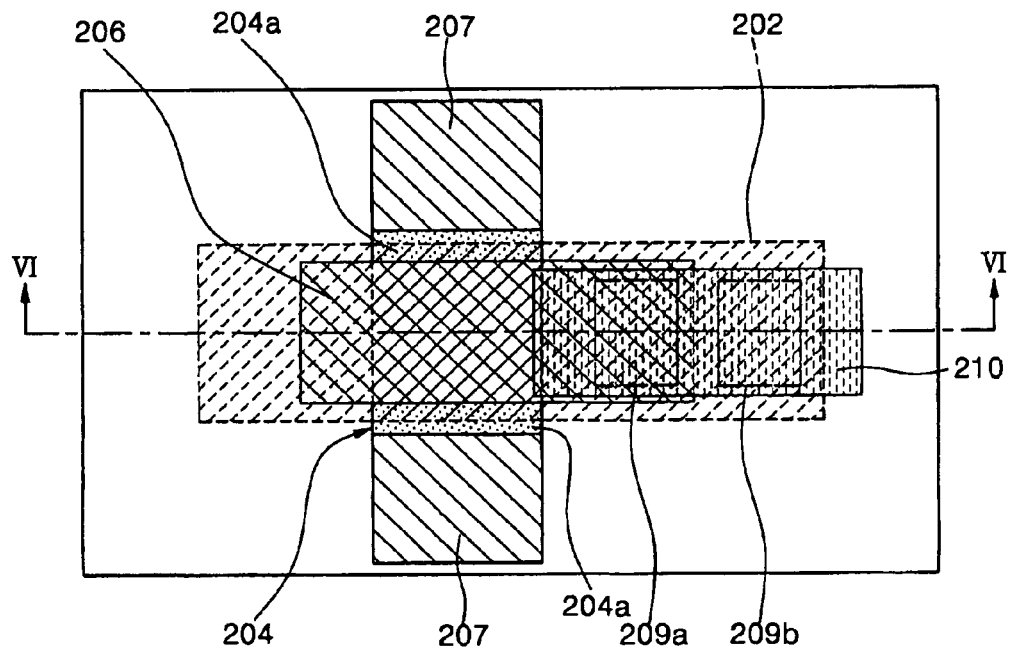

FIG. 6A is a cross-sectional view illustrating a method of fabricating a TFT according to an exemplary embodiment of the present invention, and FIG. 6B is a plan view of the TFT depicted in FIG. 6A. The cross-section of FIG. 6A is taken along the line VI-VI of FIG. 6B.

Referring to FIGS. 6A and 6B, a conductive layer is formed on the substrate 200 having the first and second contact holes 209a and 209b and then patterned, thereby forming a gate-body contact portion 210.

When the TFT fabricated according to an exemplary embodiment of the present invention is used in an FPD, such as an OLED display device, the first and second contact holes 209a and 209b may be formed at the same time (or concurrently) with via holes that expose portions of source and drain electrodes of a driving TFT to connect a first electrode of the FPD and the source and drain electrodes of the driving TFT, and the gate-body contact portion 210 may be formed of the same material (e.g., indium tin oxide(ITO) or indium zinc oxide(IZO)) as the first electrode of the FPD. That is, the gate-body contact portion 210 may be formed at the same time (or concurrently) with the first electrode of the FPD.

As the TFT used in the FPD is reduced in size, the threshold voltage of the TFT is dropped, and thus a saturation region of a drain current is reduced and the drain current decreases. These problems can be solved by forming the gate-body contact portion 210 that connects the channel region of the semiconductor layer and the gate electrode 202.

The threshold voltage of the TFT depends on a substrate bias. Since the substrate bias is typically a reverse bias with respect to a source, the threshold voltage of the TFT increases. However, in exemplary embodiment 1 of the present invention, the channel region is connected to the gate electrode 202 by the interconnection portion 206 and the gate-body contact portion 210. Accordingly, the influence of the reverse bias is reduced or removed, the threshold voltage of the TFT is reduced, and thus a subthreshold slope may be improved.

Exemplary Embodiment 2

Figure 7A:
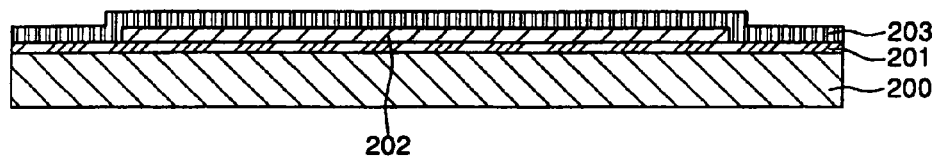
FIGS. 7A, 8A, 9A, 10A, 11A, 12A, and 13A are cross-sectional views illustrating a method of fabricating a TFT according to another exemplary embodiment of the present invention.
Figure 7B:
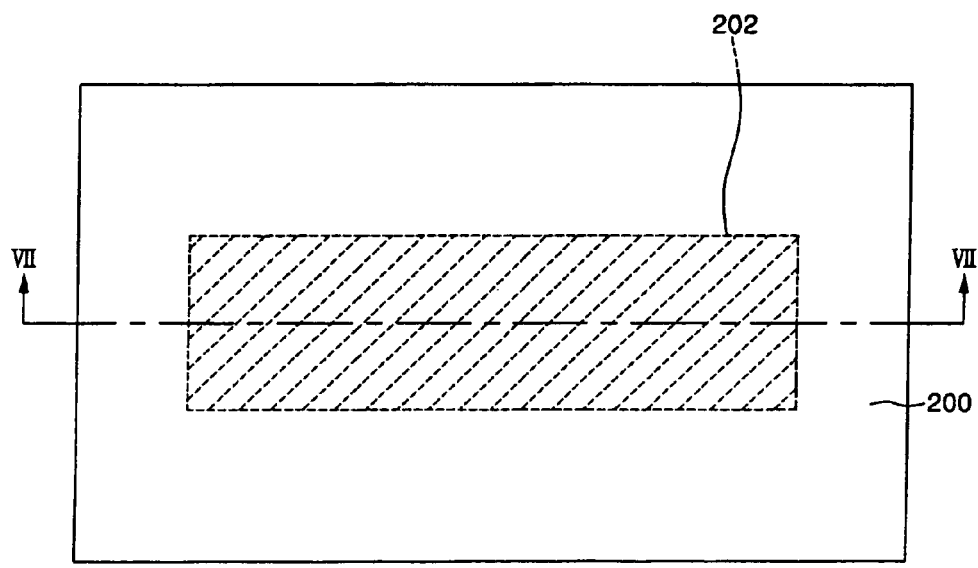
FIGS. 7B, 8B, 9B, 10B, 11B, 12B, and 13B are plan views of the TFT fabricating stages depicted in FIGS. 7A, 8A, 9A, 10A, 11A, 12A, and 13A, respectively.

FIG. 7A is a cross-sectional view illustrating a method of fabricating a TFT according to another exemplary embodiment of the present invention, and FIG. 7B is a plan view of the partially fabricated TFT depicted in FIG. 7A. The cross-section of FIG. 7A is taken along the line VII-VII of FIG. 7B.

Referring to FIGS. 7A and 7B, a buffer layer 201 is formed on a substrate 200, which is a glass substrate or a plastic substrate. The buffer layer 201 prevents moisture or impurities generated on the substrate from diffusing into an element to be formed later and to regulate a heat transmission rate during crystallization, thereby enabling a semiconductor layer to be smoothly crystallized.

Thereafter, a material for a gate electrode is formed on the buffer layer 201 and then patterned, thereby forming a gate electrode 202.

Thereafter, a gate insulating layer 203 is formed on the substrate 200 having the gate electrode 202. In this case, the gate insulating layer 203 may be a silicon oxide layer, a silicon nitride layer, or a composite layer of the silicon oxide and silicon nitride layers.

Figure 8A:
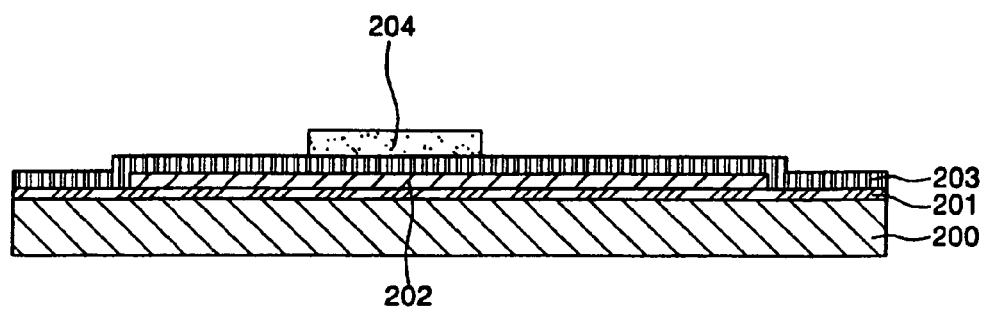
Figure 8B:
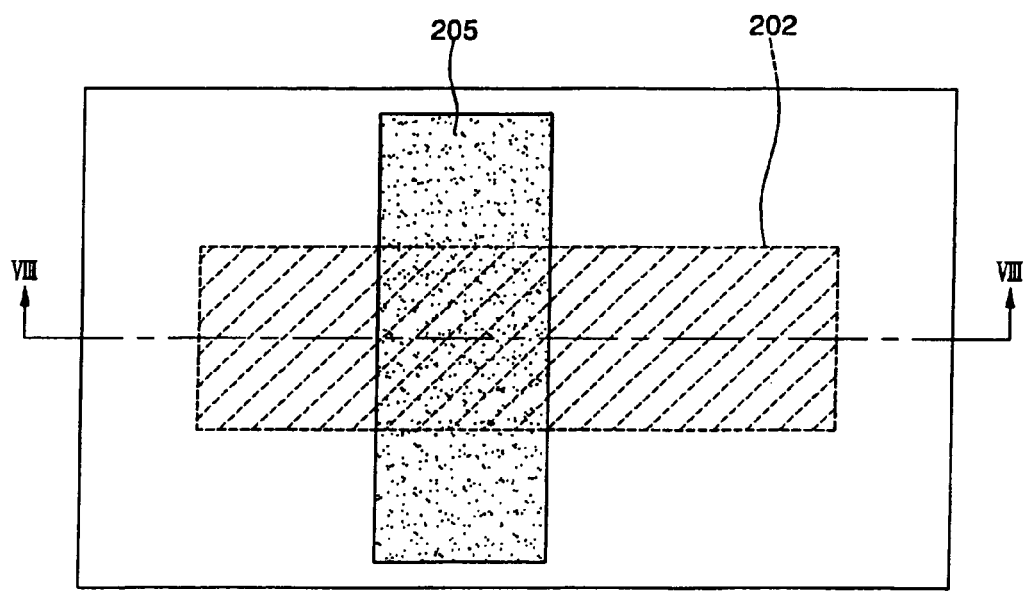

FIG. 8A is a cross-sectional view illustrating a method of fabricating a TFT according to another exemplary embodiment of the present invention, and FIG. 8B is a plan view of the partially fabricated TFT depicted in FIG. 8A. The cross-section of FIG. 8A is taken along the line VIII-VIII of FIG. 8B.

Referring to FIGS. 8A and 8B, a first silicon material is deposited on the substrate 200 having the gate insulating layer 203 and then patterned, thereby forming a first silicon layer 204.

In this case, an a-Si:H layer may be deposited as the first silicon material on the gate insulating layer 203 using a PVD process, a CVD process, or any other suitable process known to those skilled in the art. Also, the a-Si:H layer may be crystallized into a poly-Si layer and then patterned to form the first silicon layer 204. Here, the crystallization of the a-Si:H layer may be performed by an RTA process, an SPC process, an ELA process, an MIC process, an MILC process, an SLS process, or any other suitable process known to those skilled in the art.

The first silicon layer 204 may overlap the gate electrode 202 at a predetermined region. In this case, the predetermined region may be defined as a channel region.

Figure 9A:
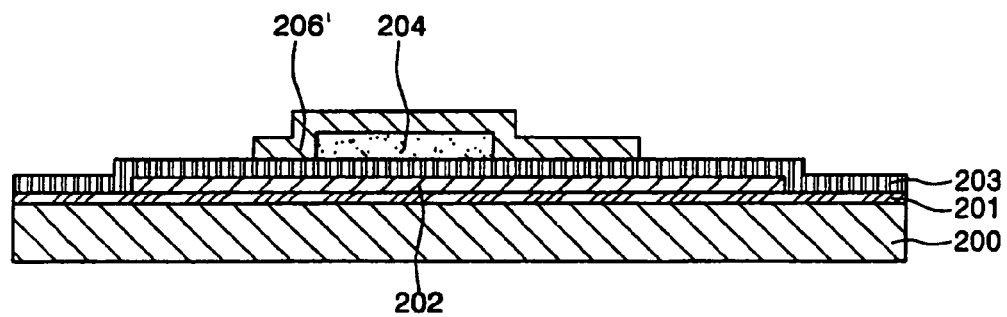
Figure 9B:
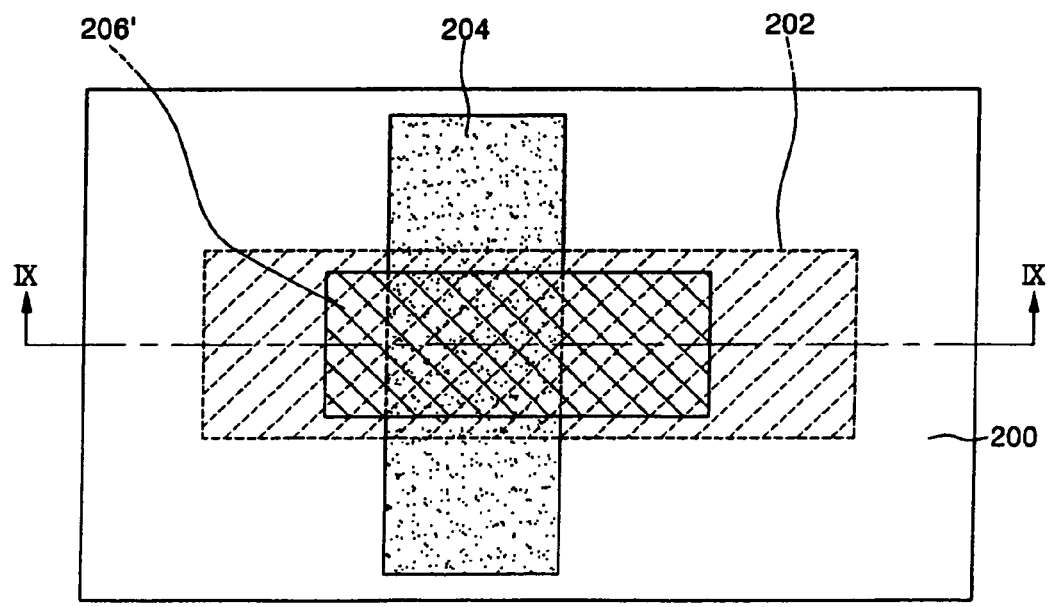

FIG. 9A is a cross-sectional view illustrating a method of fabricating a TFT according to another exemplary embodiment of the present invention, and FIG. 9B is a plan view of the partially fabricated TFT depicted in FIG. 9A. The cross-section of FIG. 9A is taken along the line IX-IX of FIG. 9B.

Referring to FIGS. 9A and 9B, a conductive layer is formed on the substrate 200 having the first silicon layer 204 and then patterned, thereby forming an interconnection portion 206'.

Referring to FIG. 9B, the interconnection portion 206' may have a width equal to or slightly less than the width of a region where the first silicon layer 204 overlaps the gate electrode 202 (i.e., the channel region). Here, regions of the first silicon layer 204, which do not overlap the gate electrode 202, may be defined as source and drain regions. In this case, the interconnection portion 206 can effectively remove hole-electron pairs generated by the channel region.

Figure 10A:
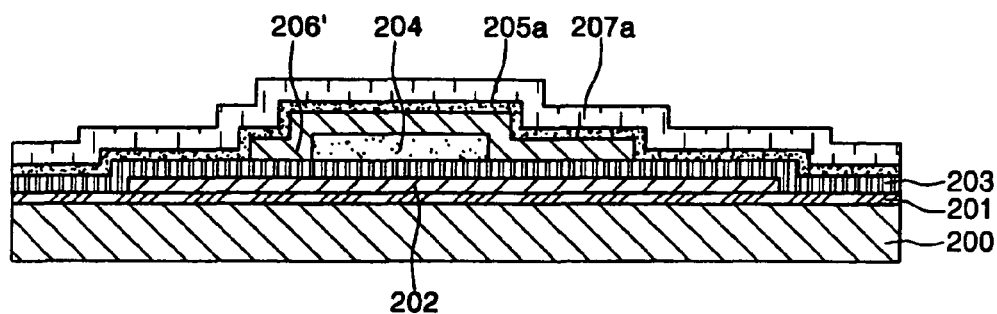
Figure 10B:
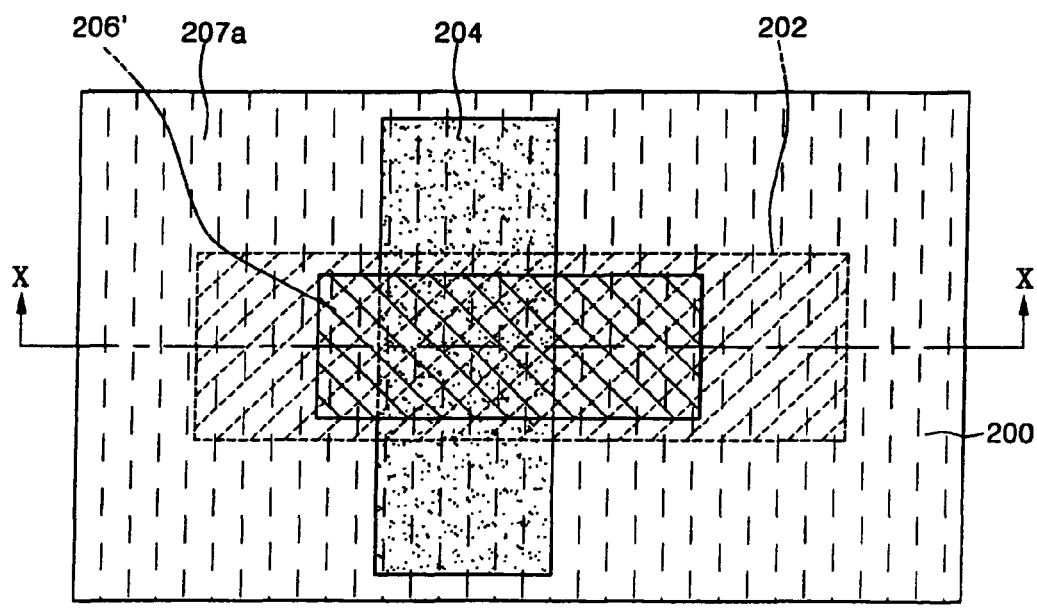

FIG. 10A is a cross-sectional view illustrating a method of fabricating a TFT according to another exemplary embodiment of the present invention, and FIG. 10B is a plan view of the partially fabricated TFT depicted in FIG. 10A. The cross-section of FIG. 10A is taken along the line X-X of FIG. 10B.

Referring to FIGS. 10A and 10B, a second silicon material 205a is formed on the substrate 200 having the interconnection portion 206'. In this case, the second silicon material 205a is a heavily doped silicon material.

Thereafter, a material 207a for source and drain electrodes is formed on the second silicon material 205a.

Figure 11A:
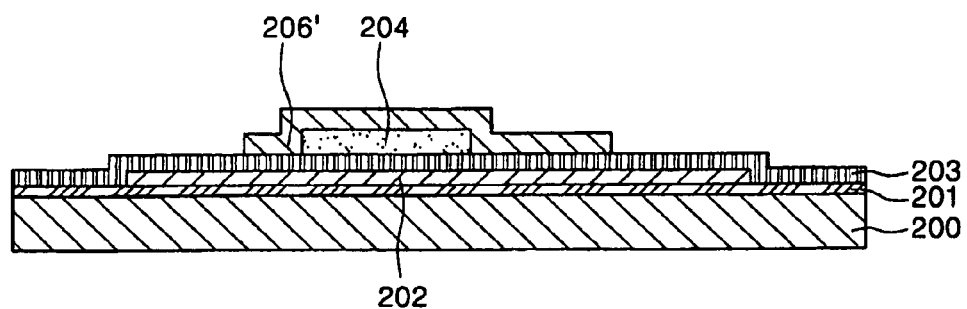
Figure 11B:
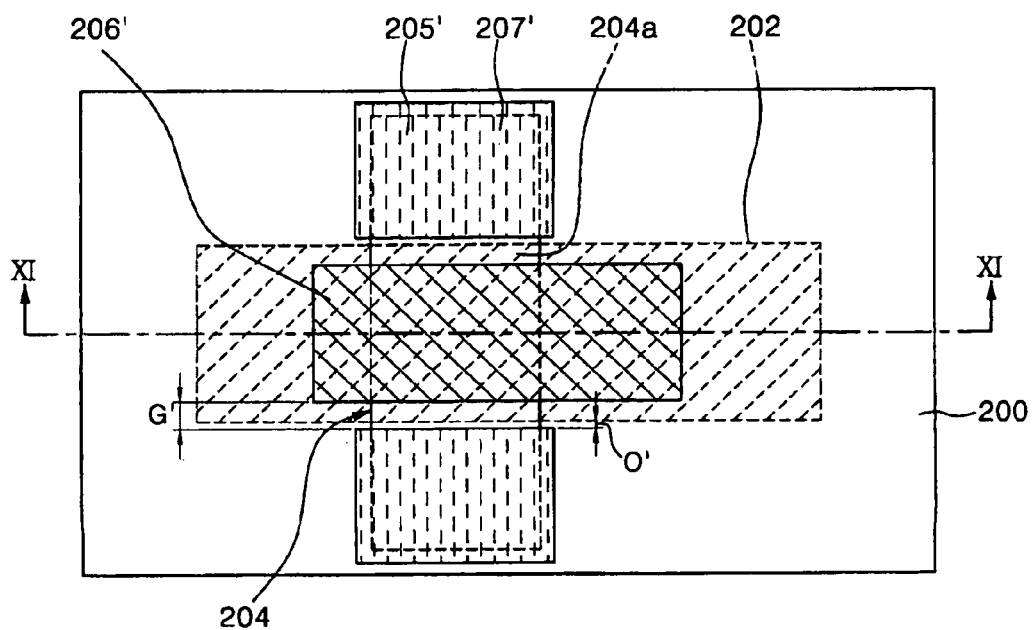

FIG. 11A is a cross-sectional view illustrating a method of fabricating a TFT according to another exemplary embodiment of the present invention, and FIG. 11B is a plan view of the partially fabricated TFT depicted in FIG. 11A. The cross-section of FIG. 11A is taken along the line XI-XI of FIG. 11B.

Referring to FIGS. 11A and 11B, the second silicon material 205a and the material 207a for source and drain electrodes are patterned, thereby forming a second silicon layer 205' and source and drain electrodes 207'.

The second silicon layer 205' is a heavily doped silicon layer, which is interposed between the first silicon layer 204 and the source and drain electrodes 207' and electrically connects the first silicon layer 204 and the source and drain electrodes 207'. By way of example, the second silicon layer 205' may be formed of an $n^+$-Si layer to lower contact resistance.

Since the source and drain electrodes 207' and the second silicon layer 205' are formed, regions of the first silicon layer 204 under the source and drain electrodes 207' may be defined as source and drain regions.

Referring to FIG. 11B, regions of the first silicon layer 204 between the gate electrode 202 and the source and drain electrodes 207', which are undoped and do not correspond to the gate electrode 202, may be defined as offset regions each having a width "O". Also, impurities may be lightly doped into exposed regions (each having a width "G") of the first silicon layer 204 between the interconnection portion 206' and the source and drain electrodes 207' using the interconnection portion 206' and the source and drain electrodes 207' as masks, thereby forming LDD regions 204a.

Accordingly, the first silicon layer 204 may be a semiconductor layer that includes at least the channel region and the source and drain regions and further includes the LDD regions 204a or the offset regions.

Figure 12A:
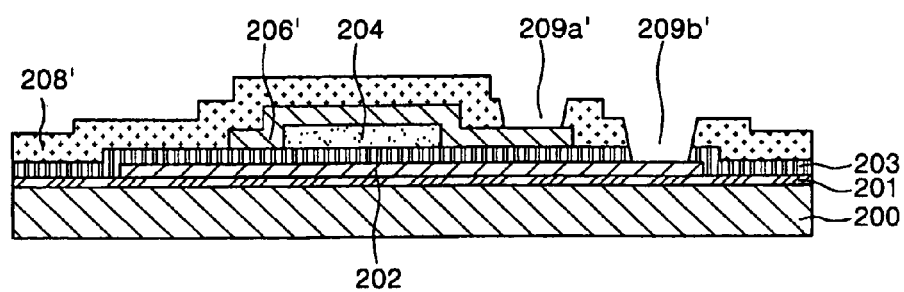
Figure 12B:
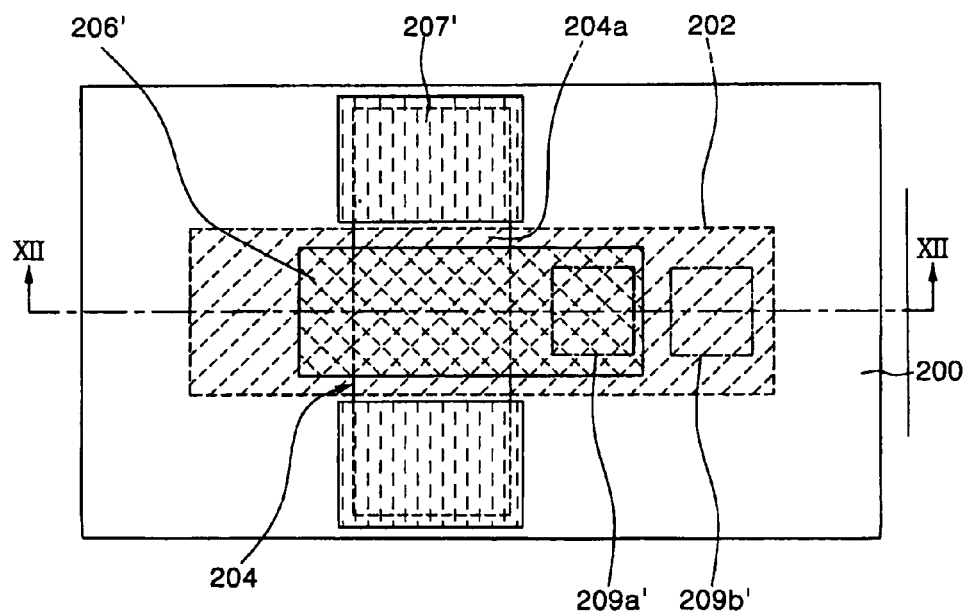

FIG. 12A is a cross-sectional view illustrating a method of fabricating a TFT according to another exemplary embodiment of the present invention, and FIG. 12B is a plan view of the partially fabricated TFT depicted in FIG. 12A. The cross-section of FIG. 12A is taken along the line XII-XII of FIG. 12B.

Referring to FIGS. 12A and 12B, an interlayer insulating layer 208' is formed on the substrate 200 having the interconnection portion 206' and the source and drain electrodes 207'.

Thereafter, a predetermined region of the interlayer insulating layer 208' is etched, thereby forming a first contact hole 209a' to expose a predetermined region of the interconnection portion 206'. Also, predetermined regions of the interlayer insulating layer 208' and the gate insulating layer 203 are etched, thereby forming a second contact hole 209b' to expose a predetermined region of the gate electrode 202.

Figure 13A:
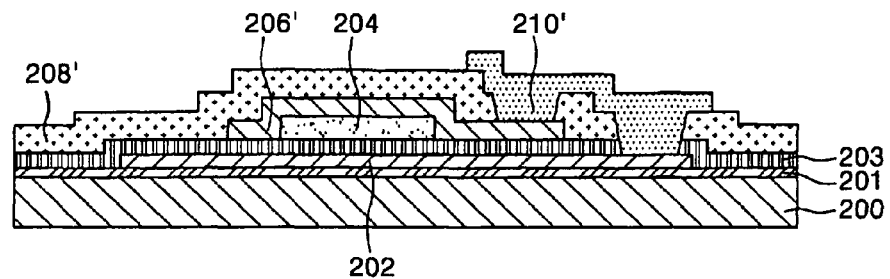
Figure 13B:
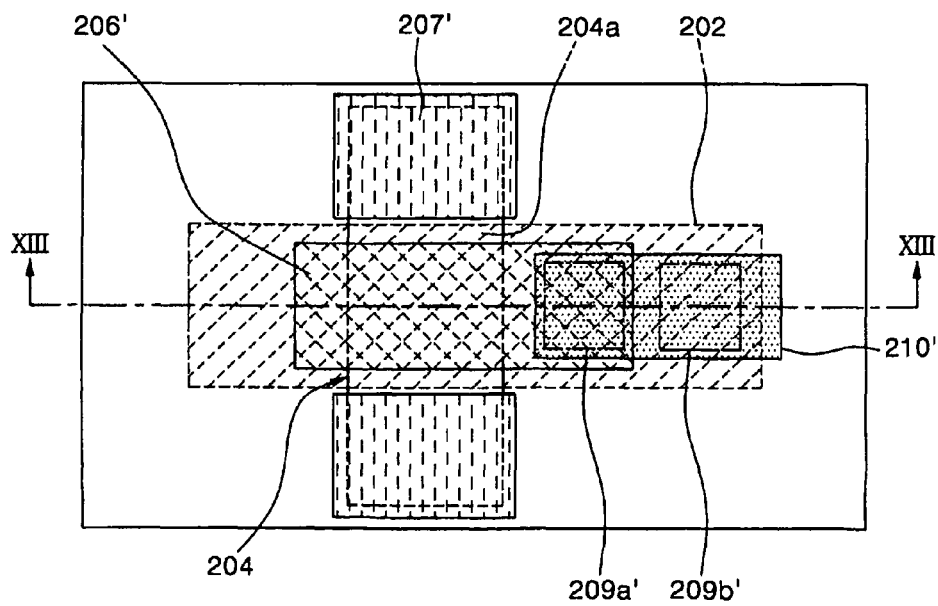

FIG. 13A is a cross-sectional view illustrating a method of fabricating a TFT according to another exemplary embodiment of the present invention, and FIG. 13B is a plan view of the partially fabricated TFT depicted in FIG. 13A. The cross-section of FIG. 13A is taken along the line XIII-XIII of FIG. 13B.

Referring to FIGS. 13A and 13B, a conductive layer is formed on the substrate 200 having the first and second contact holes 209a' and 209b' and then patterned, thereby forming a gate-body contact portion 210'.

When the TFT fabricated according to another exemplary embodiment of the present invention is used in an FPD, such as an OLED display device, the first and second contact holes 209a' and 209b' may be formed at the same time (or concurrently) with via holes that exposes portions of source and drain electrodes of a driving TFT to connect a first electrode of the FPD and the source and drain electrodes of the driving TFT, and the gate-body contact portion 210' may be formed of the same material (e.g., ITO or IZO) as the first electrode of the FPD. That is, the gate-body contact portion 210' may be formed at the same time (or concurrently) with the first electrode of the FPD.

As the TFT used in the FPD is reduced in size, the threshold voltage of the TFT is dropped, and thus a saturation region of a drain current is reduced and the drain current decreases. These problems can be solved by forming the gate-body contact portion 210' that connects the channel region of the semiconductor layer and the gate electrode 202.

The threshold voltage of the TFT depends on a substrate bias. Since the substrate bias is typically a reverse bias with respect to a source, the threshold voltage of the TFT increases. However, in exemplary embodiment 2 of the present invention, the channel region is connected to the gate electrode 202 by the interconnection portion 206' and the gate-body contact portion 210'. Accordingly, the influence of the reverse bias is reduced or removed, the threshold voltage of the TFT is reduced, and thus a subthreshold slope may be improved.

Figure 14:
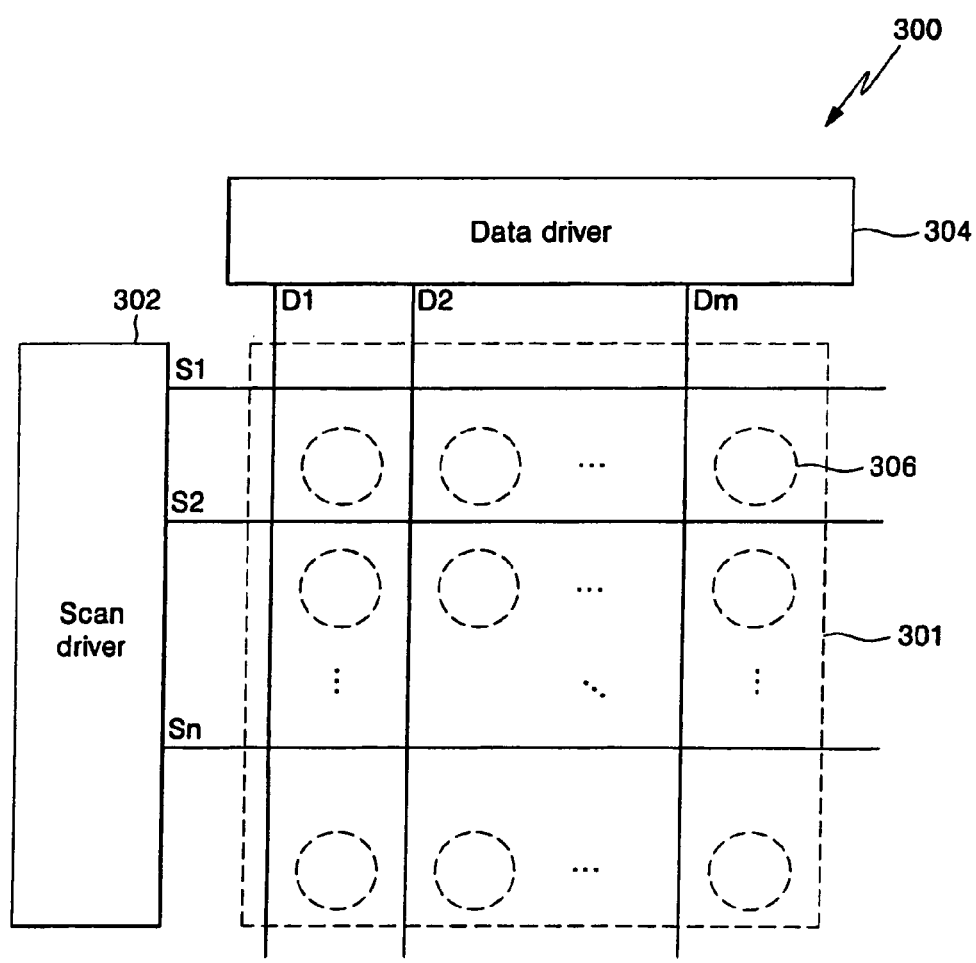
FIG. 14 is a schematic diagram of a display device having a TFT fabricated in accordance with one embodiment of the present invention.

FIG. 14 is a schematic diagram of a display device 300 having TFTs fabricated in accordance with one embodiment of the present invention. As can be seen in FIG. 14, the display device 300 includes a plurality of pixels 306 coupled to scan lines S1 to Sn and data lines D1 to Dm, in a display area 301. A scan driver 302 provides scan signals to the scan lines, and a data driver 304 provides data signals to the data lines. Each pixel includes at least one TFT (e.g., a driving TFT and/or a switching TFT) fabricated in accordance with the described embodiment of the present invention, as shown in FIGS. 6A, 6B or 13A, 13B, for example.

According to the embodiments of the present invention as described above, the influence of a substrate bias is reduced or removed. Thus, a threshold voltage decreases, a subthreshold slope can be improved, and a large drain current can be obtained at a low gate voltage.

While exemplary embodiments of the present invention have been described herein, it will be apparent to those of ordinary skill in the art that various modifications in form and detail can be made to the described embodiments without departing from the spirit and scope of the present invention as defined by the appended claims and their equivalents.

What is claimed is:

1. A thin film transistor (TFT) comprising:
a substrate;
a gate electrode on the substrate;
a gate insulating layer on the gate electrode, such that the gate electrode is between the gate insulating layer and the substrate in a first direction normal to the substrate;
a semiconductor layer on the gate insulating layer, such that the gate insulating layer is between the semiconductor layer and the substrate in the first direction, the semiconductor layer including a channel region, a source region, and a drain region;
an interconnection portion at least partially in a different layer above or below that of the semiconductor layer and directly contacting the channel region of the semiconductor layer; and
a gate-body contact portion electrically connecting the interconnection portion and the gate electrode,
wherein the semiconductor layer is between the interconnection portion and the gate electrode in the first direction.

2. The TFT according to claim 1, further comprising a heavily doped semiconductor layer between the channel region and the interconnection portion in the first direction.

3. A thin film transistor (TFT) comprising:
a substrate;
a gate electrode on the substrate;
a gate insulating layer on the gate electrode, such that the gate electrode is between the gate insulating layer and the substrate in a first direction normal to the substrate;
a semiconductor layer on the gate insulating layer, such that the gate insulating layer is between the semiconductor layer and the substrate in the first direction, the semiconductor layer including a channel region, a source region, and a drain region;
an interconnection portion directly contacting the channel region of the semiconductor layer; and
a gate-body contact portion electrically connecting the interconnection portion and the gate electrode,
further comprising source and drain electrodes, respectively, on the source and drain regions of the semiconductor layer,
wherein the interconnection portion is in the same layer as the source and drain electrodes, and
wherein the semiconductor layer is between the interconnection portion and the gate electrode in the first direction.

4. The TFT according to claim 1, further comprising:
source and drain electrodes, respectively, on the source and drain regions of the semiconductor layer; and
heavily doped semiconductor layers respectively between the source and drain regions and the source and drain electrodes.

5. The TFT according to claim 1, further comprising an interlayer insulating layer between the gate electrode and the gate-body contact portion,
wherein the interlayer insulating layer includes contact holes through which the gate-body contact portion is in contact with the interconnection portion and the gate electrode.

6. The TFT according to claim 1, further comprising lightly doped drain (LDD) regions or offset regions respectively between the channel region of the semiconductor layer and the source and drain regions.

7. The TFT according to claim 1, wherein the gate-body contact portion comprises indium tin oxide (ITO) or indium zinc oxide (IZO).

8. A thin film transistor (TFT) comprising:
a substrate;
a gate electrode and a semiconductor layer disposed on the substrate, the semiconductor layer having a region overlapping the gate electrode;
an interconnection portion electrically contacting the overlapped region of the semiconductor layer, a contact region between the interconnection portion and the overlapped region of the semiconductor layer being smaller than the overlapped region of the semiconductor layer; and
a gate-body contact portion electrically connecting the interconnection portion and the gate electrode.

9. The TFT according to claim 8, further comprising a heavily doped semiconductor layer interposed between the interconnection portion and the semiconductor layer.

10. The TFT according to claim 8,
wherein the semiconductor layer includes source and drain regions spaced apart from the overlapped region of the semiconductor layer,
wherein the TFT further comprises source and drain electrodes respectively disposed on the source and drain regions, and
wherein the interconnection portion is disposed on the same layer as the source and drain electrodes.

11. The TFT according to claim 10, further comprising LDD regions or offset regions respectively interposed between the overlapped region of the semiconductor layer and the source and drain regions.

12. The TFT according to claim 8,
wherein the semiconductor layer includes source and drain regions spaced apart from the overlapped region of the semiconductor layer, and
wherein the TFT further comprises:
source and drain electrodes respectively disposed on the source and drain regions; and
heavily doped semiconductor layers respectively interposed between the source and drain regions and the source and drain electrodes.

13. The TFT according to claim 12, further comprising LDD regions or offset regions respectively interposed between the overlapped region of the semiconductor layer and the source and drain regions.

14. The TFT according to claim 8, further comprising an interlayer insulating layer interposed between the gate electrode and the gate-body contact portion,
wherein the interlayer insulating layer includes contact holes through which the gate-body contact portion is in contact with the interconnection portion and the gate electrode.

15. The TFT according to claim 8, wherein the gate-body contact portion is formed of ITO or IZO.

16. A display device comprising:
a substrate; and
a plurality of pixels on the substrate,
wherein at least one of the pixels comprises a thin film transistor (TFT) comprising:
a gate electrode on the substrate;
a gate insulating layer on the gate electrode, such that the gate electrode is between the gate insulating layer and the substrate in a first direction normal to the substrate;

a semiconductor layer on the gate insulating layer, such that the gate insulating layer is between the semiconductor layer and the substrate in the first direction, the semiconductor layer including a channel region, a source region, and a drain region;

an interconnection portion at least partially in a different layer above or below that of the semiconductor layer and directly contacting the channel region of the semiconductor layer; and a gate-body contact portion electrically connecting the interconnection portion and the gate electrode, and wherein the semiconductor layer is between the interconnection portion and the gate electrode in the first direction.

17. The TFT according to claim 3, further comprising a heavily doped semiconductor layer between the channel region and the interconnection portion in the first direction.

18. The display device according to claim 16, further comprising a heavily doped semiconductor layer between the channel region and the interconnection portion in the first direction.

* * * * *